(12) United States Patent
Ren et al.

(10) Patent No.: US 10,871,688 B2
(45) Date of Patent: Dec. 22, 2020

(54) ARRAY SUBSTRATE, MANUFACTURING METHOD THEREOF, AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Jinyu Ren, Beijing (CN); Dan Wang, Beijing (CN); Changjian Xu, Beijing (CN); Guojing Ma, Beijing (CN); Bo Zhou, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 27 days.

(21) Appl. No.: 15/512,582

(22) PCT Filed: May 27, 2016

(86) PCT No.: PCT/CN2016/083644
§ 371 (c)(1),
(2) Date: Mar. 20, 2017

(87) PCT Pub. No.: WO2017/156877
PCT Pub. Date: Sep. 21, 2017

(65) Prior Publication Data
US 2019/0011790 A1    Jan. 10, 2019

(30) Foreign Application Priority Data
Mar. 14, 2016 (CN) .......................... 2016 1 0143214

(51) Int. Cl.
*H01L 23/528* (2006.01)
*G02F 1/1362* (2006.01)
(Continued)

(52) U.S. Cl.
CPC .... *G02F 1/136227* (2013.01); *G02F 1/13439* (2013.01); *G02F 1/134309* (2013.01);
(Continued)

(58) Field of Classification Search
CPC .......... G02F 1/136227; G02F 1/13439; G02F 1/134309; G02F 2201/123;
(Continued)

(56) References Cited

U.S. PATENT DOCUMENTS

2002/0047567 A1   4/2002  Fujita et al.
2004/0085164 A1*  5/2004  Hirabayashi ............ H01P 1/203
                                                        333/204
(Continued)

FOREIGN PATENT DOCUMENTS

CN    101159273 A    4/2008
CN    102548254 A    7/2012
(Continued)

OTHER PUBLICATIONS

First Office Action for Chinese Application No. 201610143214.3, dated Jan. 2, 2018, 6 Pages.
(Continued)

*Primary Examiner* — Steven H Loke
*Assistant Examiner* — Samuel Park
(74) *Attorney, Agent, or Firm* — Brooks Kushman P.C.

(57) ABSTRACT

An array substrate, a manufacturing method thereof and a display device are provided. The array substrate includes a first conductive pattern, an insulation layer covering the first conductive pattern, and a second conductive pattern arranged on the insulation layer. The insulation layer includes a via-hole through which the first conductive pattern is connected to the second conductive pattern. A con-
(Continued)

ductive post connected to the first conductive pattern and the second conductive pattern is formed in the via-hole.

7 Claims, 5 Drawing Sheets

(51) Int. Cl.
*H01L 27/12* (2006.01)
*G02F 1/1343* (2006.01)
*G02F 1/1337* (2006.01)
*G02F 1/1368* (2006.01)

(52) U.S. Cl.
CPC ............ *H01L 27/12* (2013.01); *H01L 27/124* (2013.01); *H01L 27/1262* (2013.01); *G02F 1/1337* (2013.01); *G02F 1/1368* (2013.01); *G02F 2201/121* (2013.01); *G02F 2201/123* (2013.01)

(58) Field of Classification Search
CPC ............ G02F 2201/121; G02F 1/1368; G02F 1/1337; H01L 27/1262; H01L 27/124; H01L 27/1225; H01L 29/7869; H01L 27/1248; H01L 27/1259; H01L 27/1288; H01L 27/1244; H01L 27/1255; H01L 27/127; H01L 2924/0002; H01L 29/66969; H01L 27/1157; H01L 27/11575; H01L 27/11582; H01L 27/1214; H01L 27/3262
See application file for complete search history.

(56) References Cited

U.S. PATENT DOCUMENTS

| | | | | |
|---|---|---|---|---|
| 2005/0001331 | A1* | 1/2005 | Kojima | H01L 23/3121 257/778 |
| 2009/0025215 | A1* | 1/2009 | Murakami | G02F 1/136227 29/846 |
| 2013/0009160 | A1 | 1/2013 | Katsui et al. | |
| 2013/0248235 | A1* | 9/2013 | Hsu | H01L 23/49822 174/260 |
| 2014/0120657 | A1* | 5/2014 | Hung | H01L 29/66969 438/104 |
| 2014/0151895 | A1* | 6/2014 | West | H01L 23/481 257/774 |
| 2015/0028341 | A1* | 1/2015 | Sun | H01L 29/78633 257/72 |

FOREIGN PATENT DOCUMENTS

| | | |
|---|---|---|
| CN | 102637698 B | 12/2014 |
| CN | 105552024 A | 5/2016 |
| KR | 100251096 B1 * | 5/2000 |

OTHER PUBLICATIONS

International Search Report and Written Opinion for Application No. PCT/CN2016/083644, dated Dec. 19, 2016 10 Pages.
1$^{st}$ Chinese Office Action, English Translation.
International Search Report and Written Opinion, English Translation.
CN101159273A, English Abstract and Translation.
CN102548254A, English Abstract and Translation.
CN105552024A, English Abstract and Translation.
CN102637698B, English Abstract and Translation.

\* cited by examiner

ARRAY SUBSTRATE, MANUFACTURING METHOD THEREOF, AND DISPLAY DEVICE

CROSS-REFERENCE TO RELATED APPLICATION APPLICATIONS

This application is the U.S. national phase of PCT Application No. PCT/CN2016/083644 filed on May 27, 2016, which claims priority to Chinese Patent Application No. 201610143214.3 filed on Mar. 14, 2016, the disclosures of which are incorporated in their entirety by reference herein.

TECHNICAL FIELD

The present disclosure relates to the field of display technology, in particular to an array substrate, a manufacturing method thereof, and a display device.

BACKGROUND

For an array substrate, it is necessary to provide via-holes through which patterns at different film layers may be connected to each other. The via-holes include a via-hole through which a pixel electrode is connected to a drain electrode of a thin film transistor (TFT), and a via-hole through which a common electrode is connected to a common electrode line. Usually, these via-holes are relatively narrow and deep, so depressions may easily occur at positions where the via-holes are formed. In this way, in the case that an alignment film is coated onto the array substrate, diffusion unevenness may easily occur at the positions where the via-holes are formed, and thereby such a defect as Mura may occur for a resultant display panel.

SUMMARY

An object of the present disclosure is to provide an array substrate, a manufacturing method thereof, and a display device, so as to prevent the occurrence of such a defect as Mura due to the diffusion unevenness at the positions where the via-holes are formed, thereby to improve a display effect of the display device.

In one aspect, the present disclosure provides in some embodiments an array substrate, including a first conductive pattern, an insulation layer covering the first conductive pattern, and a second conductive pattern arranged on the insulation layer. The insulation layer includes a via-hole through which the first conductive pattern is connected to the second conductive pattern. A conductive post connected to the first conductive pattern and the second conductive pattern is formed in the via-hole.

In a possible embodiment of the present disclosure, an upper surface of the conductive post has a horizontal level that is not lower than that of an upper surface of the insulation layer.

In a possible embodiment of the present disclosure, the upper surface of the conductive post has a horizontal level that is identical to that of the upper surface of the insulation layer.

In a possible embodiment of the present disclosure, the conductive post is made of an organic conductive polymer or a metal.

In a possible embodiment of the present disclosure, the conductive post includes a resin column object and a conductive material enclosing the resin column object.

In a possible embodiment of the present disclosure, an outer surface of the conductive post is in contact with an entire inner surface of the via-hole.

In a possible embodiment of the present disclosure, the first conductive pattern is a drain electrode of a TFT, and the second conductive pattern is a pixel electrode.

In a possible embodiment of the present disclosure, the pixel electrode covers the upper surface of the conductive post.

In a possible embodiment of the present disclosure, the insulation layer includes a passivation layer.

In a possible embodiment of the present disclosure, the first conductive pattern is a common electrode line, and the second conductive pattern is a common electrode.

In a possible embodiment of the present disclosure, the common electrode covers the upper surface of the conductive post.

In a possible embodiment of the present disclosure, the insulation layer includes a gate insulation layer and a passivation layer.

In another aspect, the present disclosure provides in some embodiments a display device including the above-mentioned array substrate.

In yet another aspect, the present disclosure provides in some embodiments a method for manufacturing an array substrate. The array substrate includes a first conductive pattern, an insulation layer covering the first conductive pattern, and a second conductive pattern arranged on the insulation layer. The insulation layer includes a via-hole through which the first conductive pattern is connected to the second conductive pattern. The method includes steps of: forming a conductive post connected to the first conductive pattern in the via-hole; and forming the second conductive pattern connected to the conductive post.

In a possible embodiment of the present disclosure, the first conductive pattern is a drain electrode of a TFT, the second conductive pattern is a pixel electrode, and the insulation layer includes a passivation layer. The method includes steps of: providing a base substrate; forming a gate electrode of the TFT on the base substrate; forming a gate insulation layer; forming a pattern of an active layer; forming a source electrode and the drain electrode of the TFT and the conductive post through a single patterning process, the conductive post being connected to the drain electrode; forming the passivation layer, and etching the passivation layer so as to expose the conductive post; and forming the pixel electrode connected to the conductive post.

In a possible embodiment of the present disclosure, the first conductive pattern is a drain electrode of a TFT, the second conductive pattern is a pixel electrode, and the insulation layer includes a passivation layer. The method includes steps of: providing a base substrate; forming a gate electrode of the TFT and the conductive post on the base substrate through a single patterning process; forming a gate insulation layer; forming a pattern of an active layer, and etching the gate insulation layer and the active layer so as to expose the conductive post; forming a source electrode and the drain electrode of the TFT, the drain electrode being connected to the conductive post; forming the passivation layer, and etching the passivation layer so as to expose the conductive post; and forming the pixel electrode connected to the conductive post.

In a possible embodiment of the present disclosure, the first conductive pattern is a common electrode line, the second conductive pattern is a common electrode, and the insulation layer includes a gate insulation layer and a passivation layer. The method includes steps of: providing a base substrate; forming a gate electrode of a TFT, the common electrode line and the conductive post on the base substrate through a single patterning process, the conductive post being connected to the common electrode line; forming the gate insulation layer; forming a pattern of an active layer; forming a source electrode and a drain electrode of the TFT; forming the passivation layer, and etching the gate insulation layer and the passivation layer so as to expose the conductive post; and forming the common electrode connected to the conductive post.

According to the embodiments of the present disclosure, the conductive post is formed in the via-hole in the insulation layer, and connected to the first conductive pattern and the second conductive pattern at different layers, so the first conductive pattern may be electrically connected to the second conductive pattern through the conductive post. In addition, the conductive post is filled within the via-hole, so it is able to provide the insulation layer with a flat surface and prevent the occurrence of depressions at the position where the via-hole is located. As a result, it is able to prevent the occurrence of such a defect as Mura due to diffusion unevenness of an alignment film at the position where the via-hole is located, thereby to improve a display effect of the display device.

REFERENCE SIGN LIST 1 base substrate
2 gate metal layer
3 gate insulation layer
4 source-drain metal layer
5 passivation layer
6 pixel electrode
7 pixel electrode via-hole
8 common electrode
9 common electrode via-hole
10 conductive post

DETAILED DESCRIPTION

In order to make the objects, the technical solutions and the advantages of the present disclosure more apparent, the present disclosure will be described hereinafter in a clear and complete manner in conjunction with the drawings and embodiments.

In the related art, depressions may easily occur at a position where a via-hole is located, and in the case that an alignment film is coated onto an array substrate, diffusion unevenness of the alignment film may easily occur at the position where the via-hole is located. An object of the present disclosure is to provide an array substrate, a manufacturing method thereof, and a display device, so as to prevent the occurrence of such a defect as Mura due to the diffusion unevenness of the alignment film at the position where the via-hole is located, thereby to improve a display effect of the display device.

Figure 1:
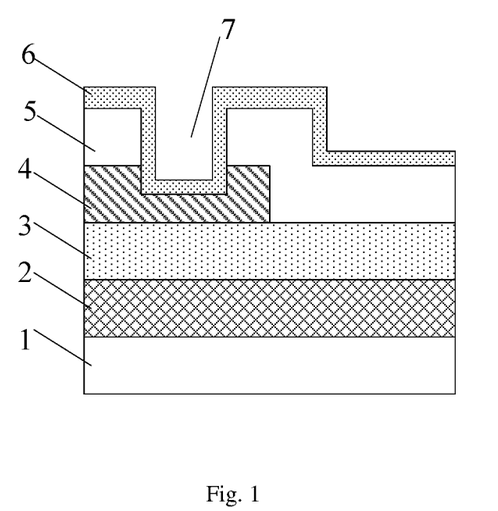
FIG. 1 is a schematic view showing a pixel electrode via-hole in a array substrate in the related art.
Figure 2:
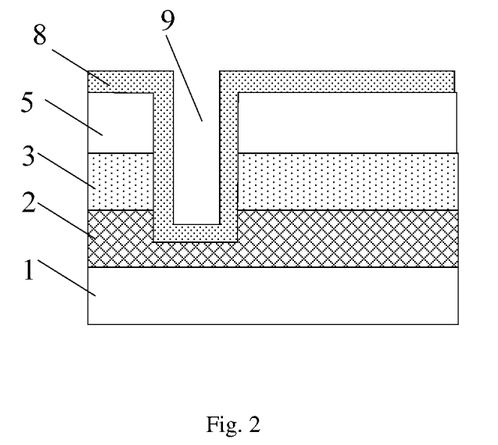
FIG. 2 is a schematic view showing a common electrode via-hole in the array substrate in the related art.

As shown in FIGS. 1 and 2, for a array substrate in the related art, it is necessary to provide via-holes through which patterns at different film layers may be connected to each other. The via-holes include a pixel electrode via-hole 7 through which a pixel electrode 6 is connected to a drain electrode of a TFT, and a common electrode via-hole 9 through which a common electrode 8 is connected to a common electrode line. Usually, each via-hole has a size of 7 μm*7 μm, i.e., it is relatively narrow and deep, so depressions may easily occur at positions where the via-holes are located. When an alignment film is coated onto the array substrate, diffusion unevenness of the alignment film may easily occur at the positions where the via-holes are located, and thereby such a defect as Mura may occur for a resultant display panel.

The present disclosure provides in some embodiments an array substrate, including a first conductive pattern, an insulation layer covering the first conductive pattern, and a second conductive pattern arranged on the insulation layer. The insulation layer includes a via-hole through which the first conductive pattern is connected to the second conductive pattern. A conductive post connected to the first conductive pattern and the second conductive pattern is formed in the via-hole.

According to the embodiments of the present disclosure, the conductive post is formed in the via-hole in the insulation layer, and connected to the first conductive pattern and the second conductive pattern at different film layers, so the first conductive pattern may be electrically connected to the second conductive pattern through the conductive post. In addition, the conductive post is filled within the via-hole, so it is able to provide the insulation layer with a flat surface and prevent the occurrence of depressions at the position where the via-hole is located. As a result, it is able to prevent the occurrence of such a defect as Mura due to diffusion unevenness of an alignment film at the position where the via-hole is located, thereby to improve a display effect of the display device.

In a possible embodiment of the present disclosure, an upper surface of the conductive post has a horizontal level that is not lower than that of an upper surface of the insulation layer, so as to prevent the occurrence of depressions at the position where the via-hole is located.

In a possible embodiment of the present disclosure, the upper surface of the conductive post has a horizontal level that is same with that of the upper surface of the insulation layer, so as to provide the insulation layer with a flat surface at the position where the via-hole is located.

In a possible embodiment of the present disclosure, conductive post may be made of an organic conductive polymer or a metal.

In another possible embodiment of the present disclosure, a main body of the conductive post may be a resin column object, and a conductive material covers the resin column object.

The present disclosure further provides in some embodiments a method for manufacturing an array substrate. The array substrate includes a first conductive pattern, an insulation layer covering the first conductive pattern, and a second conductive pattern arranged on the insulation layer. The insulation layer includes a via-hole through which the first conductive pattern is connected to the second conductive pattern. The method includes steps of: forming a conductive post connected to the first conductive pattern in the via-hole prior to forming the second conductive pattern; and forming the second conductive pattern connected to the conductive post.

According to the embodiments of the present disclosure, prior to forming the second conductive pattern on the insulation layer, the conductive post is formed in the via-hole in the insulation layer and connected to the first conductive pattern under the insulation layer, so the first conductive pattern may be electrically connected to the second conductive pattern through the conductive post. In addition, the conductive post is filled within the via-hole, so it is able to provide the insulation layer with a flat surface and prevent the occurrence of depressions at the position where the via-hole is located. As a result, it is able to prevent the occurrence of such a defect as Mura due to diffusion unevenness of an alignment film at the position where the via-hole is located, thereby to improve a display effect of the display device.

In a possible embodiment of the present disclosure, the first conductive pattern is a drain electrode of a TFT, the second conductive pattern is a pixel electrode. The method includes steps of: providing a base substrate; forming a gate electrode of the TFT on the base substrate; forming a gate insulation layer; forming a pattern of an active layer; forming a source electrode and the drain electrode of the TFT and the conductive post through a single patterning process, the conductive post being connected to the drain electrode; forming the passivation layer, and etching the passivation layer so as to expose the conductive post; and forming the pixel electrode connected to the conductive post.

In the above-mentioned steps, the conductive post and the source electrode and the drain electrode of the TFT may be formed through a single patterning process, so it is able to form the conductive post without any additional patterning process, thereby to simplify the manufacture of the array substrate.

In a possible embodiment of the present disclosure, the first conductive pattern is a drain electrode of a TFT, the second conductive pattern is a pixel electrode. The method includes steps of: providing a base substrate; forming a gate electrode of the TFT and the conductive post on the base substrate through a single patterning process; forming a gate insulation layer; forming a pattern of an active layer, and etching the gate insulation layer and the active layer so as to expose the conductive post; forming a source electrode and the drain electrode of the TFT, the drain electrode being connected to the conductive post; forming the passivation layer, and etching the passivation layer so as to expose the conductive post; and forming the pixel electrode connected to the conductive post.

In the above-mentioned steps, the conductive post and the gate electrode of the TFT may be formed through a single patterning process, so it is able to form the conductive post without any additional patterning process, thereby to simplify the manufacture of the array substrate.

In a possible embodiment of the present disclosure, the first conductive pattern is a common electrode line, the second conductive pattern is a common electrode. The method includes steps of: providing a base substrate; forming a gate electrode of a TFT, the common electrode line and the conductive post on the base substrate through a single patterning process, the conductive post being connected to the common electrode line; forming the gate insulation layer; forming a pattern of an active layer; forming a source electrode and a drain electrode of the TFT; forming the passivation layer, and etching the gate insulation layer and the passivation layer so as to expose the conductive post; and forming the common electrode connected to the conductive post.

In the above-mentioned steps, the conductive post, the gate electrode of the TFT and the common electrode line may be formed through a single patterning process, so it is able to form the conductive post without any additional patterning process, thereby to simplify the manufacture of the array substrate.

Figure 3:
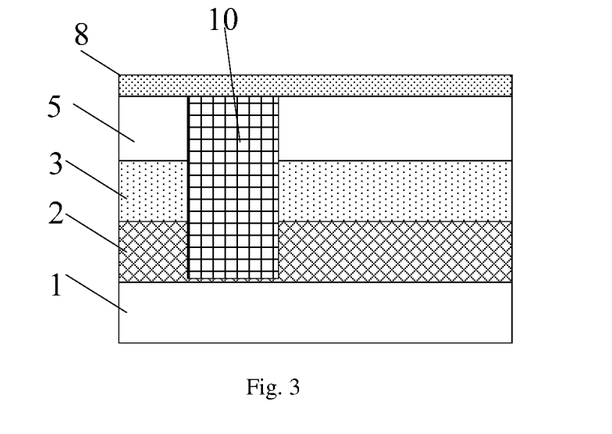
FIG. 3 is a schematic view showing an array substrate according to at least one embodiment of the present disclosure.
Figure 4:
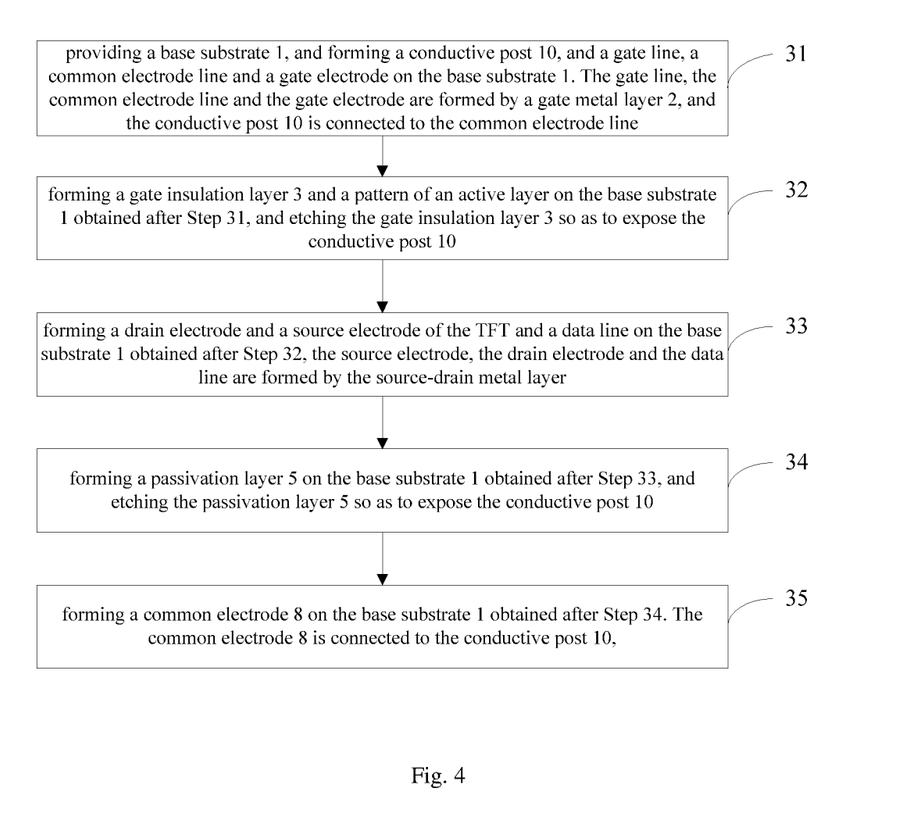
FIG. 4 is a flow chart of a method for manufacturing the array substrate in FIG. 3.

The present disclosure provides in some embodiments a method for manufacturing an array substrate which, as shown in FIGS. 3-4, includes Steps 31 to 35.

Step 31: providing a base substrate 1, and forming a conductive post 10, and a gate line, a common electrode line and a gate electrode on the base substrate 1. The gate line, the common electrode line and the gate electrode are formed by a gate metal layer 2, and the conductive post 10 is connected to the common electrode line.

The base substrate 1 may be a glass or quartz substrate. The conductive post 10 may be made of a material identical to the gate metal layer, so it is able to form the conductive post 10, the gate line, the common electrode line and the gate electrode through a single patterning process. The conductive post 10 may also be made of an organic conductive polymer.

In addition, a main body of the conductive post 10 may be a resin column object, and a conductive material may cover the resin column object. At this time, the conductive post 10 may be formed by a patterning process different from the gate line, the common electrode line and the gate electrode of the TFT. In the case that the main body of the conductive post 10 is the resin column object, the resin column object may be formed in advance at a predetermined position, and after the subsequent formation of the gate metal layer or a source-drain metal layer, the gate metal layer or source-drain metal layer on the resin column object may be reserved as the conductive layer covering the resin column object.

Step 32: forming a gate insulation layer 3 and a pattern of an active layer on the base substrate 1 obtained after Step 31, and etching the gate insulation layer 3 so as to expose the conductive post 10.

Step 33: forming a drain electrode and a source electrode of the TFT and a data line on the base substrate 1 obtained after Step 32, the source electrode, the drain electrode and the data line are formed by the source-drain metal layer.

Step 34: forming a passivation layer 5 on the base substrate 1 obtained after Step 33, and etching the passivation layer 5 so as to expose the conductive post 10.

Further, in Step 32, the gate insulation layer 3 may not be etched, and instead, after the formation of the passivation layer 5, the gate insulation layer 3 and the passivation layer 5 may be etched at the same time, so as to expose the conductive post 10.

Step 35: forming a common electrode 8 on the base substrate 1 obtained after Step 34. The common electrode 8 is connected to the conductive post 10, so as to acquire the structure as shown in FIG. 3.

In these embodiments of the present disclosure, the conductive post 10 may be filled within the via-hole through which the common electrode is connected to the common electrode line, so it is able to provide the insulation layer with a flat surface and prevent the occurrence of depressions at the position where the via-hole is located, thereby to prevent the occurrence of such a defect as Mura due to the diffusion unevenness of the alignment film at the position where the via-hole is located and improve a display effect of the display device.

Figure 5:
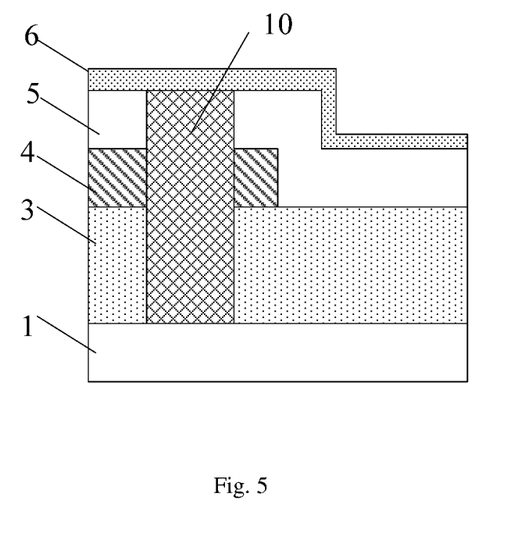
FIG. 5 is another schematic view showing the array substrate according to at least one embodiment of the present disclosure.
Figure 6:
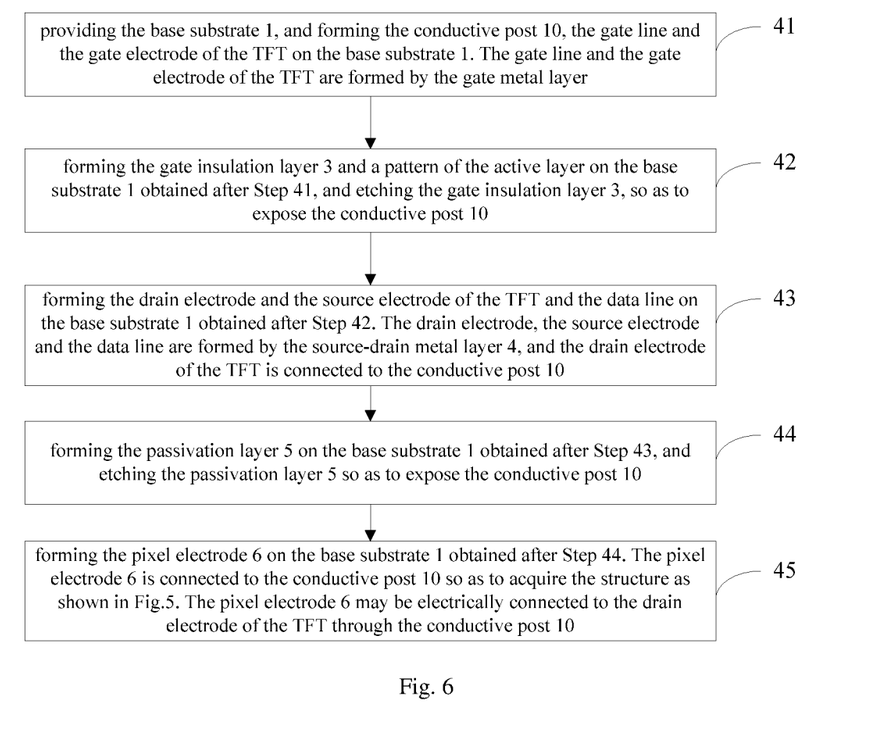
FIG. 6 is another flow chart of the method for manufacturing the array substrate in FIG. 5.

The present disclosure further provides in some embodiments a method for manufacturing an array substrate which, as shown in FIGS. 5-6, includes Steps 41 to 45.

Step 41: providing the base substrate 1, and forming the conductive post 10, the gate line and the gate electrode of the TFT on the base substrate 1. The gate line and the gate electrode of the TFT are formed by the gate metal layer.

The base substrate 1 may be a glass or quartz substrate. The conductive post 10 may be made of a material identical to the gate metal layer, so it is able to form the conductive post 10, the gate line and the gate electrode through a single patterning process. The conductive post 10 may also be made of an organic conductive polymer.

In addition, a main body of the conductive post 10 may be a resin column object, and a conductive material may enclose the resin column object. At this time, the conductive post 10 may be formed by a patterning process different from the gate line and the gate electrode of the TFT. In the case that the main body of the conductive post 10 is the resin column object, the resin column object may be formed in advance at a predetermined position, and after the subsequent formation of the gate metal layer or a source-drain metal layer, the gate metal layer or source-drain metal layer on the resin column object may be reserved as the conductive layer enclosing the resin column object.

Step 42: forming the gate insulation layer 3 and a pattern of the active layer on the base substrate 1 obtained after Step 41, and etching the gate insulation layer 3, so as to expose the conductive post 10.

Step 43: forming the drain electrode and the source electrode of the TFT and the data line on the base substrate 1 obtained after Step 42. The drain electrode, the source electrode and the data line are formed by the source-drain metal layer 4, and the drain electrode of the TFT is connected to the conductive post 10.

Step 44: forming the passivation layer 5 on the base substrate 1 obtained after Step 43, and etching the passivation layer 5 so as to expose the conductive post 10.

Step 45: forming the pixel electrode 6 on the base substrate 1 obtained after Step 44. The pixel electrode 6 is connected to the conductive post 10 so as to acquire the structure as shown in FIG. 5. The pixel electrode 6 may be electrically connected to the drain electrode of the TFT through the conductive post 10.

In the embodiments of the present disclosure, the conductive post 10 may be filled within the via-hole through which the pixel electrode is connected to the drain electrode of the TFT, so it is able to provide the insulation layer with a flat surface and prevent the occurrence of depressions at the position where the via-hole is located, thereby to prevent the occurrence of such a defect as Mura due to the diffusion unevenness of the alignment film at the position where the via-hole is located and improve a display effect of the display device.

Figure 7:
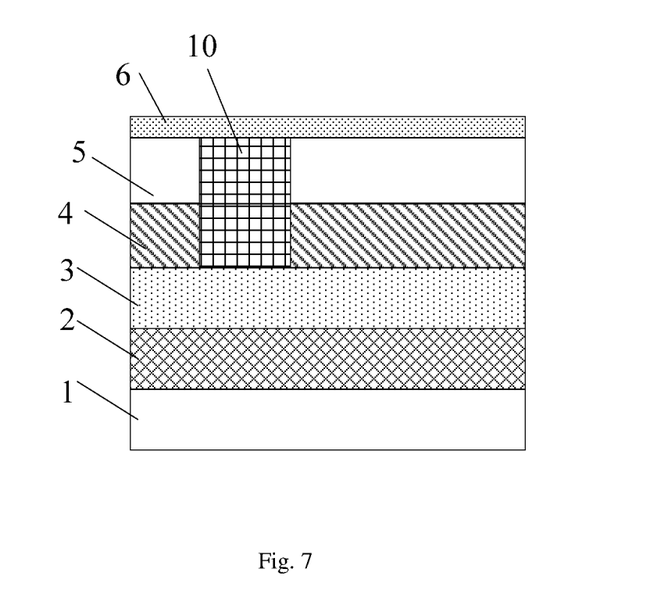
FIG. 7 is yet another schematic view showing the array substrate according to at least one embodiment of the present disclosure.
Figure 8:
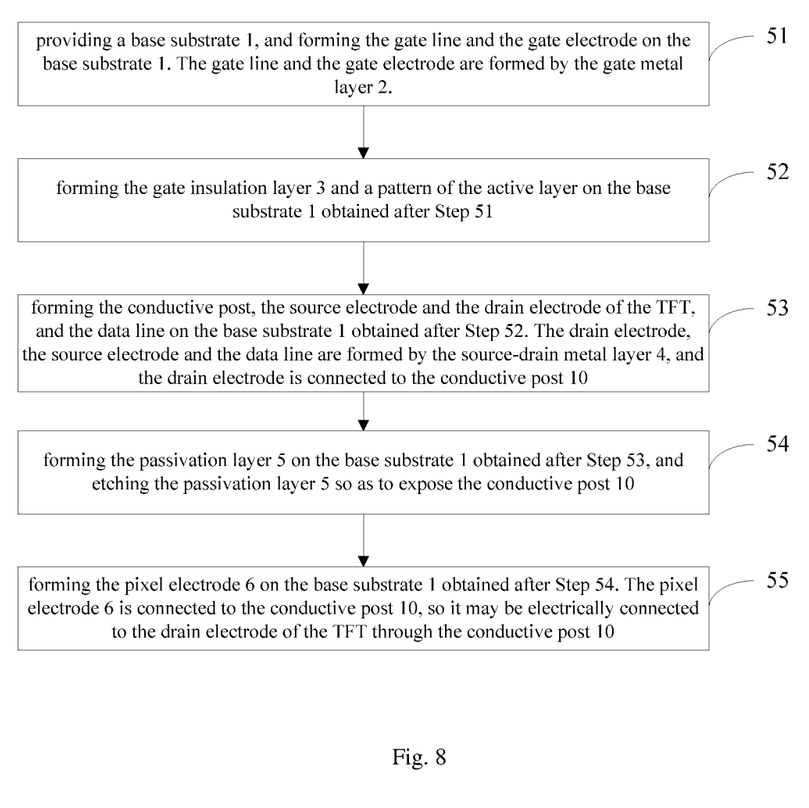
FIG. 8 is yet another flow chart of the method for manufacturing the array substrate in FIG. 7.

The present disclosure further provides in some embodiments a method for manufacturing an array substrate which, as shown in FIGS. 7-8, includes Steps 51 to 55.

Step 51: providing a base substrate 1, and forming the gate line and the gate electrode on the base substrate 1. The gate line and the gate electrode are formed by the gate metal layer 2. The base substrate 1 may be a glass or quartz substrate.

Step 52: forming the gate insulation layer 3 and a pattern of the active layer on the base substrate 1 obtained after Step 51.

Step 53: forming the conductive post, the source electrode and the drain electrode of the TFT, and the data line on the base substrate 1 obtained after Step 52. The drain electrode, the source electrode and the data line are formed by the source-drain metal layer 4, and the drain electrode is connected to the conductive post 10. The conductive post 10 may be made of a material identical to the source-drain metal layer 4, so it is able to form the conductive post 10, the drain electrode, the source electrode and the data line through a single patterning process. The conductive post 10 may also be made of an organic conductive polymer.

In addition, a main body of the conductive post 10 may be a resin column object, and a conductive material may enclose the resin column object. At this time, the conductive post 10 may be formed by a patterning process different from the drain electrode, the source electrode and the data line. In the case that the main body of the conductive post 10 is the resin column object, the resin column object may be formed in advance at a predetermined position, and after the subsequent formation of the gate metal layer or a source-drain metal layer, the gate metal layer or source-drain metal layer on the resin column object may be reserved as the conductive layer enclosing the resin column object.

Step 54: forming the passivation layer 5 on the base substrate 1 obtained after Step 53, and etching the passivation layer 5 so as to expose the conductive post 10.

Step 55: forming the pixel electrode 6 on the base substrate 1 obtained after Step 54, as shown in FIG. 7. The pixel electrode 6 is connected to the conductive post 10, so it may be electrically connected to the drain electrode of the TFT through the conductive post 10.

In the embodiments of the present disclosure, the conductive post 10 may be filled within the via-hole through which the pixel electrode is connected to the drain electrode of the TFT, so it is able to provide the insulation layer with a flat surface and prevent the occurrence of depressions at the position where the via-hole is located, thereby to prevent the occurrence of such a defect as Mura due to the diffusion unevenness of the alignment film at the position where the via-hole is located and improve a display effect of the display device.

The present disclosure further provides in some embodiments a display device including the above-mentioned array substrate. The display device may be any product or member having a display function, such as liquid crystal television, liquid crystal display, digital photo frame, mobile phone or flat-panel computer. The display device may further include a flexible circuit board, a printed circuit board and a back plate.

The above are merely the preferred embodiments of the present disclosure. Obviously, a person skilled in the art may make further modifications and improvements without departing from the spirit of the present disclosure, and these modifications and improvements shall also fall within the scope of the present disclosure.

What is claimed is:

1. An array substrate, comprising a base substrate, a first conductive pattern, an insulation layer covering the first conductive pattern, and a second conductive pattern arranged on the insulation layer, wherein the insulation layer comprises a via-hole through which the first conductive pattern is connected to the second conductive pattern, and the array substrate further comprises a conductive post,
- the conductive post fills in the via-hole, the first conductive pattern is not in direct contact with the second conductive pattern, and the first conductive pattern is connected to the second conductive pattern through the conductive post, and
- the conductive post comprises a resin column object and a conductive material enclosing the resin column object,
- the insulation layer comprises a passivation layer, an upper surface of the conductive post is coplanar with an upper surface of the passivation layer and
- the conductive post is in direct contact with the base substrate,
- wherein the first conductive pattern is a drain electrode of a thin film transistor (TFT), and the second conductive pattern is a pixel electrode.

2. The array substrate according to claim 1, wherein the conductive post comprises an organic conductive polymer or a metal.

3. The array substrate according to claim 1, wherein an outer surface of the conductive post is in contact with an entire inner surface of the via-hole.

4. The array substrate according to claim 1, wherein the pixel electrode covers the upper surface of the conductive post.

5. A display device, comprising the array substrate according to claim 1.

6. A method for manufacturing an array substrate, the array substrate comprising a base substrate, a first conductive pattern, an insulation layer covering the first conductive pattern, and a second conductive pattern arranged on the insulation layer, the insulation layer comprising a via-hole through which the first conductive pattern is connected to the second conductive pattern, wherein the method comprises:
- forming a conductive post connected to the first conductive pattern in the via-hole before forming the second conductive pattern, and;
- forming the second conductive pattern connected to the conductive post,
- wherein the conductive post fills in the via-hole, the first conductive pattern is not in direct contact with the second conductive pattern, and the first conductive pattern is connected to the second conductive pattern through the conductive post, and
- the conductive post comprises a resin column object and a conductive material enclosing the resin column object,
- the insulation layer comprises a passivation layer, an upper surface of the conductive post is coplanar with an upper surface of the passivation layer, and
- the conductive post is in direct contact with the base substrate,
- wherein the first conductive pattern is a drain electrode of a thin film transistor (TFT), and the second conductive pattern is a pixel electrode.

7. The method according to claim 6, wherein,
prior to forming the conductive post connected to the first conductive pattern in the via-hole, the method further comprises:
- providing the base substrate;
- forming a gate electrode of the TFT on the base substrate;
- forming a gate insulation layer; and
- forming a pattern of an active layer.

* * * * *